United States Patent [19]
Gersbach et al.

[11] Patent Number: 5,347,234
[45] Date of Patent: Sep. 13, 1994

[54] DIGITAL VOLTAGE CONTROLLED OSCILLATOR

[75] Inventors: John E. Gersbach, Burlington; Ilya I. Novof, Essex Junction, both of Vt.

[73] Assignee: International Business Machines Corp., Armonk, N.Y.

[21] Appl. No.: 37,202

[22] Filed: Mar. 26, 1993

[51] Int. Cl.$^5$ .................................. H03B 27/00
[52] U.S. Cl. .......................... 331/57; 331/34; 331/17; 331/1 A
[58] Field of Search ............... 331/57, 34, 17, 1 A, 331/16, 177

[56] References Cited

U.S. PATENT DOCUMENTS

| | | | |
|---|---|---|---|
| 4,536,724 | 8/1985 | Hasegawa et al. | 331/177 |
| 4,884,041 | 11/1989 | Walker | 331/57 |
| 4,935,707 | 6/1990 | Irwin et al. | 331/16 |
| 5,029,924 | 10/1991 | Jenningschecks | 331/14 |
| 5,070,310 | 12/1991 | Hietala et al. | 331/1 A |
| 5,093,632 | 3/1992 | Hietala et al. | 331/1 A |
| 5,095,287 | 3/1992 | Irwin et al. | 331/17 |
| 5,122,761 | 6/1992 | Wischermann | 331/1 A |
| 5,180,993 | 1/1993 | Dent | 331/16 |
| 5,200,712 | 4/1993 | Srivastava | 331/16 |
| 5,220,294 | 6/1993 | Ichikawa | 331/17 |

FOREIGN PATENT DOCUMENTS 580668 11/1977 U.S.S.R.

OTHER PUBLICATIONS

"Wide-Range, Variable-Frequency Oscillator Circuit", IBM Technical Disclosure Bulletin, vol. 30, No. 3, Aug. 1987, p. 1181.

Primary Examiner—Raymond A. Nelli
Attorney, Agent, or Firm—Calfee Halter & Griswold

[57] ABSTRACT

A digital phase lock loop is provided, comprising a digital voltage controlled oscillator, a phase detector, and an up/down counter. The digital voltage controlled oscillator is responsive to a first set of control signals received from the up/down counter to provide an output signal. The phase detector receives and compares the frequency of the output signal with the frequency of a reference signal and, based on the comparison, outputs to the up/down counter a second control signal which determines the status of the first set of control signals. The digital voltage controlled oscillator comprises (i) an array of delay elements and (ii) a decoder for receiving the first set of the control signals from the up/down counter and for selectively activating one or more of the delay elements in response thereto. The decoder provides a separate output line for each of the delay elements which is to be selectively activated. The logic required to implement the decoder requires only a single AND gate and a single OR gate for each of the delay elements in the array.

17 Claims, 4 Drawing Sheets

| $A_6$ | $A_5$ | $A_4$ | $A_3$ | $A_2$ | $A_1$ | r × c |
|---|---|---|---|---|---|---|
|   |   |   | 1 | 1 | 0 | 6 |
|   |   |   |   |   |   | ⋮ |
|   |   | 1 | 0 | 0 | 0 | 8 |
|   |   | 1 | 0 | 0 | 1 | 9 |
|   |   |   |   |   |   | ⋮ |
|   |   | 1 | 1 | 1 | 1 | 15 |
|   | 1 | 0 | 0 | 0 | 0 | 16 |
|   |   |   |   |   |   | ⋮ |
|   | 1 | 1 | 1 | 1 | 1 | 31 |
| 1 | 0 | 0 | 0 | 0 | 0 | 32 |
| 1 | 0 | 0 | 0 | 0 | 1 | 33 |
|   |   |   |   |   |   | ⋮ |

FIG. 4

DIGITAL VOLTAGE CONTROLLED OSCILLATOR

FIELD OF THE INVENTION

The present invention relates generally to voltage controlled oscillators and more particularly to a high precision digital voltage controlled oscillator.

BACKGROUND OF THE INVENTION

Digital phase lock loops are used in a variety of applications, one of which is the field of data communications. Often included as part of a digital phase lock loop is a voltage controlled oscillator (VCO) which is used to track a reference frequency by outputting a signal of a variably controlled frequency. The voltage controlled oscillator often takes the form of a ring oscillator which comprises a serial chain of stages, each of which provides a delay increment. The individual stages may be inverting or noninverting, but the output of the serial chain must be an inversion of its input to insure oscillation.

The frequency of the output of the voltage controlled ring oscillator is varied by changing the delay provided by each stage in the chain. The delay of each stage may be controlled by either an analog or a digital control signal applied to an input to the stage. In the case of an analog control signal, noise present on the control signal tends to cause jitter in the output of the oscillator.

Digital voltage controlled ring oscillators apply digital control signals to the inputs of stages in the oscillator to reduce the effect of such noise. Such digital ring oscillators typically utilize inverters as delay elements configured in a single serial chain. By varying the voltage input to one or more of the inverters, the delay provided by the inverters changes, thereby varying the output frequency of the oscillator. The period of the oscillator output increases, and thus its frequency decreases, as more delay elements are activated in the serial chain of the ring oscillator. The effect that a particular delay element has on the output frequency of the oscillator decreases proportionately as the number of delay elements increases. Thus, the delay increment provided by a particular delay element in a serial chain may shortened while increasing the number of delay elements in the serial chain. Shortening the delay increment permits the voltage controlled oscillator to more precisely follow the reference frequency.

By adding delay elements to the chain in a conventional digital voltage controlled oscillator, however, the circuitry required to decode the digital control input signals to the oscillator becomes necessarily more complex. Moreover, the minimum delay increment attainable even with more complex decoding circuitry is limited by the delay increment provided by a particular delay element. These types of conventional voltage controlled oscillators normally suffer from the delay increment being too large to provide sufficient frequency resolution to precisely follow the reference frequency.

It is an object of the present invention, then, to provide a digital controlled voltage oscillator which provides a smaller delay increment than that attainable with conventional oscillators, without increasing the complexity of circuitry required to decode the control signal inputs to the delay elements. It is a further object of the invention to provide such a digital voltage controlled oscillator which insures a monotonic output by either increasing or decreasing its output frequency for each change in the status of the digital control signal inputs.

SUMMARY OF THE INVENTION

The present invention provides a digital phase lock loop including a voltage controlled oscillator which tracks a reference signal with a high degree of precision. The phase lock loop, in addition to the voltage controlled oscillator, comprises a phase detector and an up/down counter. The digital voltage controlled oscillator is responsive to a first set of control signals received from the up/down counter to provide an output signal of a controllable frequency. The phase detector receives and compares the frequency of the output signal with the frequency of a reference signal and, based on the comparison, outputs to the up/down counter a second control signal which determines the status of the first set of control signals.

The digital voltage controlled oscillator comprises a decoder and an array of delay elements. The decoder receives the first set of control signals from the up/down counter and in response thereto selectively activates one or more of the delay elements in the array by means of decoder output lines. The array of delay elements comprises a matrix of rows and columns of individual delay elements, each of which comprises an inverter and a capacitor connected in series.

In operation, the up/down counter receives the second control signal, which is an error signal generated by the phase detector representing the difference between the reference frequency and the voltage controlled oscillator output frequency. The up/down counter counts up if the error signal indicates that the output frequency is greater than the reference frequency, and counts down if the error signal indicates that the output frequency is less than the reference frequency. The count registered in the up/down counter is indicated by the status of the first set of control signals which are output by the up/down counter to the decoder.

The first set of control signals, which are binary encoded, determine the status of the decoder output lines. The decoder output lines in turn determine which delay elements in the array are activated. One decoder output line is provided for each delay element in the array. The delay elements are selectively activated and deactivated by the decoder via their corresponding decoder output lines to switch the capacitors associated with each delay element in and out of the circuit comprising the capacitor and its corresponding inverter. The output frequency of the voltage controlled oscillator decreases as more delay elements are activated by the decoder.

The logic provided to implement the decoder in the voltage controlled oscillator comprises, at most, one AND gate and one OR gate for each delay element in the array. The binary encoded first set of control signals are used as inputs to the AND and OR gates. The outputs of each of the OR gates are the decoder output lines. This control logic requires a maximum of n control signals for arrays of less than $2^n$ delay elements.

Because the delay elements are arranged in a matrix, the absolute delay provided by the matrix is the sum of the delays provided by each of the inverter/capacitor combinations which are activated, divided by the number of rows. Accordingly, the number of rows of delay elements may be chosen as large as necessary to get an arbitrarily small delay increment for the matrix.

BRIEF DESCRIPTION OF THE DRAWINGS

FIG. 4 is a chart illustrating the control inputs provided to the decoder of FIG. 2B.

DETAILED DESCRIPTION OF THE PREFERRED EMBODIMENT

Figure 1:
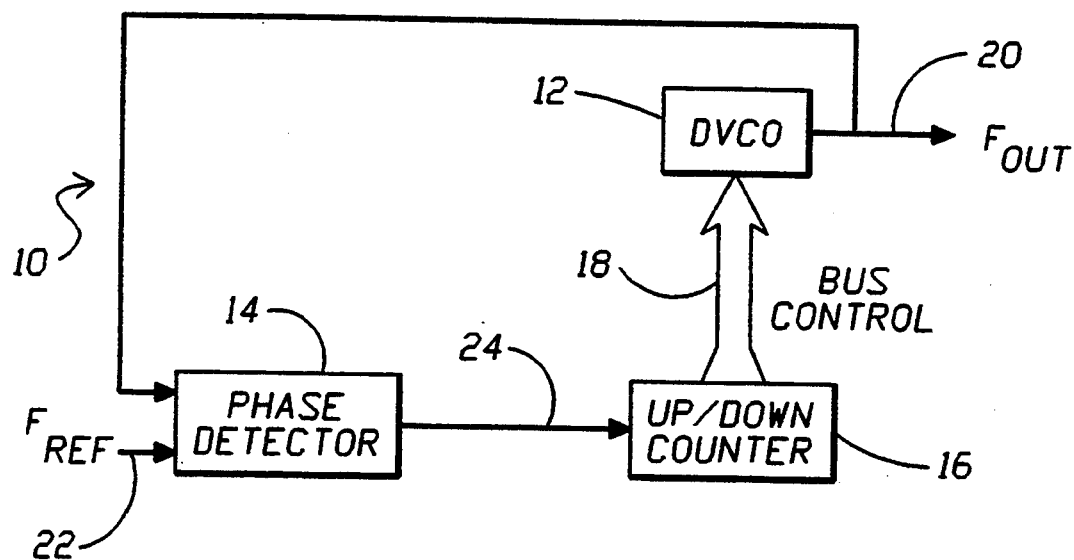
FIG. 1 is a block diagram of a digital phase lock loop which includes the digital voltage controlled oscillator of the present invention.

A schematic of a typical digital phase lock loop 10 is shown in FIG. 1, comprising a digital voltage controlled oscillator 12 constructed according to the principles of the present invention, a phase detector 14 and an up/down counter 16. The digital voltage controlled oscillator 12 is responsive to a first set of control signals 18 received from the up/down counter 16 to provide an output signal 20 having a frequency of $F_{out}$. The phase detector 14 receives and compares the frequency $F_{out}$ of the output signal 20 with the frequency $F_{ref}$ of a reference signal 22 and outputs a second control signal 24 to the up/down counter 16 based on the comparison. The up/down counter 16 determines the status of the first set of control signals 18 based on this second control signal. Although an up/down counter is shown in FIG. 1, it is contemplated that other types of digital filters may be employed to provide the function of the up/down counter 16. Other than the digital voltage controlled oscillator 12, the construction and operation of the digital phase lock loop 10 of FIG. 1 is known to those skilled in the art.

Figure 2A:
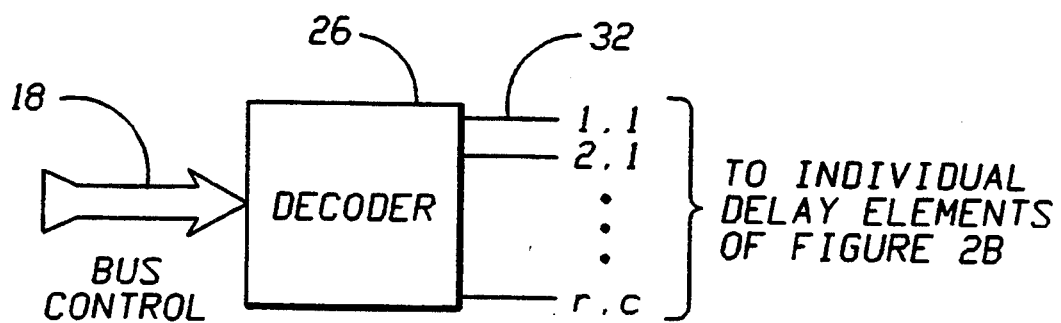
FIGS. 2A and 2B show the decoder and the array of delay elements, respectively, which together form the digital voltage controlled oscillator of FIG. 1.
Figure 2B:
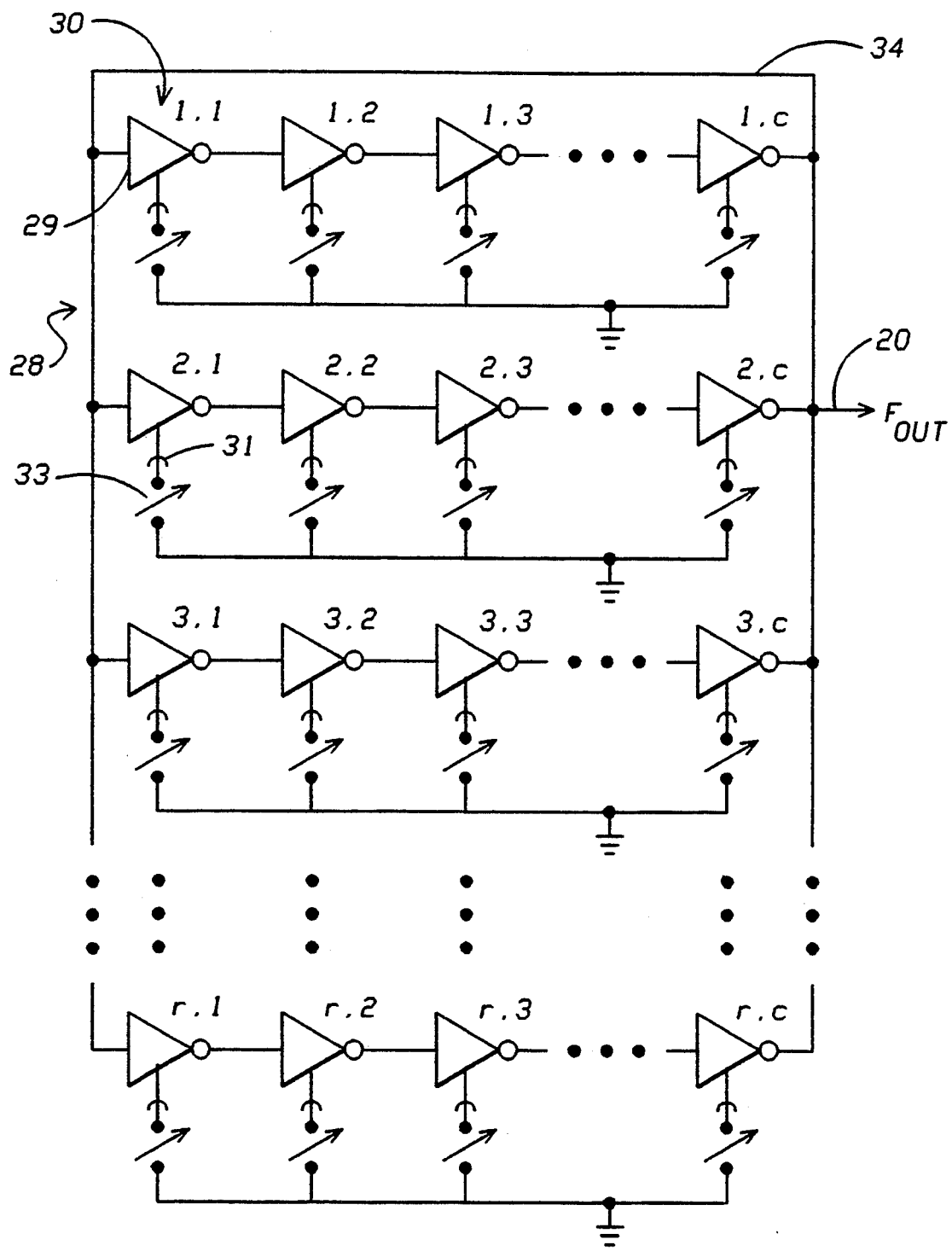

The digital voltage controlled oscillator 12 comprises (i) a decoder 26, as shown in FIG. 2A, and an array 28 of delay elements 30, as shown in FIG. 2B. The decoder 26 receives the first set of control signals 18 from the up/down counter 16 and in response thereto selectively activates one or more of the delay elements 30 in the array 28 by means of output lines 32.

The array 28 of delay elements 30 shown in FIG. 2B operates as a typical ring oscillator, except that the delay elements are arranged in a matrix of rows r and columns c, instead of merely a single row. Each of the rows r forms a ring with an electrically conductive lead 34 tying both ends of each of the rows together. Each column c of delay elements is referred to as a stage in the array. As shown in FIG. 2B, in the preferred embodiment, each of the delay elements 30 in the array 28 comprises an inverter 29 and a capacitor 31 connected to the inverter by a switch 33. However, it is contemplated that other delay element implementations known in the art may be provided, to enable discrete incremental changes in the delay provided by the delay element.

Each of the rows r of delay elements 30 consists of an odd number of inverter/capacitor combinations, each of which combinations provides a delay of $t_d$. An odd number of delay elements permits the oscillator to oscillate because as a rising logic edge propagates through the stages in the array, it becomes a falling edge, and after again propagating through the stages a second time, it again becomes a rising edge. Because the time of propagation through the stages equals $c \times t_d$, the period of the resultant oscillating signal is $2 \times c \times t_d$, and its frequency is $1/(2 \times c \times t_d)$. Each of the rows of delay elements provides sufficient gain to sustain oscillation.

In operation, the up/down counter 16 (see FIG. 1) receives the second control signal 24, which is an error signal generated by the phase detector 14. The error signal 24 takes the form of a series of pulses which are fed into the up/down counter 26. The up/down counter counts down if the error signal 24 indicates that the output signal frequency $F_{out}$ is lagging (less than) the reference frequency $F_{ref}$, and counts up if the error signal 24 indicates that the output signal frequency $F_{out}$ is leading (greater than) the reference frequency $F_{ref}$. In the steady state when the digital phase lock loop 10 is locked, the up/down counter typically alternately counts up and down by one or two counts.

The count registered in the up/down counter during real time operation is indicated by the status of the first set of control signals 18 which are output by the up/down counter to the decoder. The control signals 18, which are binary encoded, determine the status of the decoder output lines 32. The decoder output lines 32 in turn determine which delay elements 30 in the array 28 are activated. One output line 32 is provided for each of the delay elements 30 in FIG. 2B which is to be selectively activated by the decoder. In this manner, the output of the up/down counter 16 controls the frequency output of the digital voltage controlled oscillator 12.

The delay elements 30 are selectively activated and deactivated by the decoder 26 via the output lines 32 to switch the capacitors associated with each delay element in and out of the circuit comprising the capacitor 31, the inverter 29 and the switch 33. When the capacitor 31 is switched out of the circuit by the switch 33, the delay element will exhibit a minimum delay based on the inherent delay of the inverter 29, and when the capacitor 31 is switched into the circuit by the switch 33, the delay element will exhibit a somewhat larger delay.

As the up/down counter 16 counts up (indicating that the output signal frequency $F_{out}$ is greater than the reference frequency $F_{ref}$), more output lines 32 become active to selectively activate more delay elements. The absolute delay of the array 28 is thereby increased, resulting in a lower frequency output $F_{out}$, because $F_{out}$ is inversely proportional to the delay $t_d$ provided by each of the inverter/capacitor combinations, and the greater the delay, the lower the output frequency. Conversely, as the up/down counter counts down (indicating that the output signal frequency $F_{out}$ is less than the reference frequency $F_{ref}$), output lines 32 become selectively deactivated to deactivate more delay elements. The absolute delay of the array 28 is thereby decreased, resulting in a higher frequency output $F_{out}$ of the digital voltage controlled oscillator. In this manner, monotonicity of the absolute delay is guaranteed because the frequency $F_{out}$ always changes for any change in the status of the control signals 18 output by the up/down counter 16.

Because the delay elements 30 are arranged in a matrix of rows and columns, the activation or deactivation of a particular delay element will have less of an effect on the frequency output $F_{out}$ than if the delay elements were arranged in a typical ring oscillator array comprising only a single row of delay elements. In a single row configuration, the absolute delay provided by the ring oscillator is the sum of the delays $t_d$ provided by each of the inverter/capacitor combinations. However, in the matrix configuration as shown in FIG. 2B, the absolute delay provided by the matrix is the average of the delays provided by all of the rows of inverter/capacitor combinations. The delay increment provided by the matrix is equal to the delay increment provided by a single delay element divided by the number of rows in the matrix. Accordingly, the number of rows r may be chosen as large as necessary to get an arbitrarily small delay increment.

The order in which the delay elements 30 are activated (to decrease $F_{out}$) or deactivated (to increase $F_{out}$) is more important in a matrix configuration of delay elements than in a single row configuration. The order in which delay elements in a single row configuration are activated/deactivated is immaterial. However, in a matrix configuration, the delay elements should not be activated/deactivated on a column by column basis, wherein a full row of delay elements is activated/deactivated before proceeding to the next row. If all the delay elements in some rows are selected and none are selected in the remaining rows, a notch will appear in the output waveform at the output node of the array 28. This notch results from the differences in propagation delay between the rows having all delay elements activated and the rows having no active delay elements (assuming that the row includes a sufficient number of delay elements such that the transition time is short as compared to the total row propagation time).

Another consideration in the design of the matrix of delay elements is to provide rows having equal and somewhat high output impedances. This will insure good averaging of the rows, by equalizing the weighting of the delays provided by each of the rows, when computing the average delay. Such a design will also minimize the transient currents which tend to flow between rows having unequal instantaneous output voltages.

Thus, to minimize the adverse effects on the output frequency $F_{out}$ resulting from the factors outlined above, the delay elements in the array 28 are not activated/deactivated on a column by column basis, but instead on a row by row basis. Delay element $30_{1,1}$ (see FIG. 2B) is activated first, delay element $30_{2,1}$ is activated second, and so on, with the last possible delay added to the matrix by delay element $30_{r,c}$. Accordingly, the potential for a notch to appear in the output waveform at the output node of the array 28 is minimized, and the absolute delay provided by the matrix more closely approximates a true average of the sum of all of the delays $t_d$ provided by each of the active inverter/capacitor combinations in the rows divided by the number of rows r.

Figure 3:
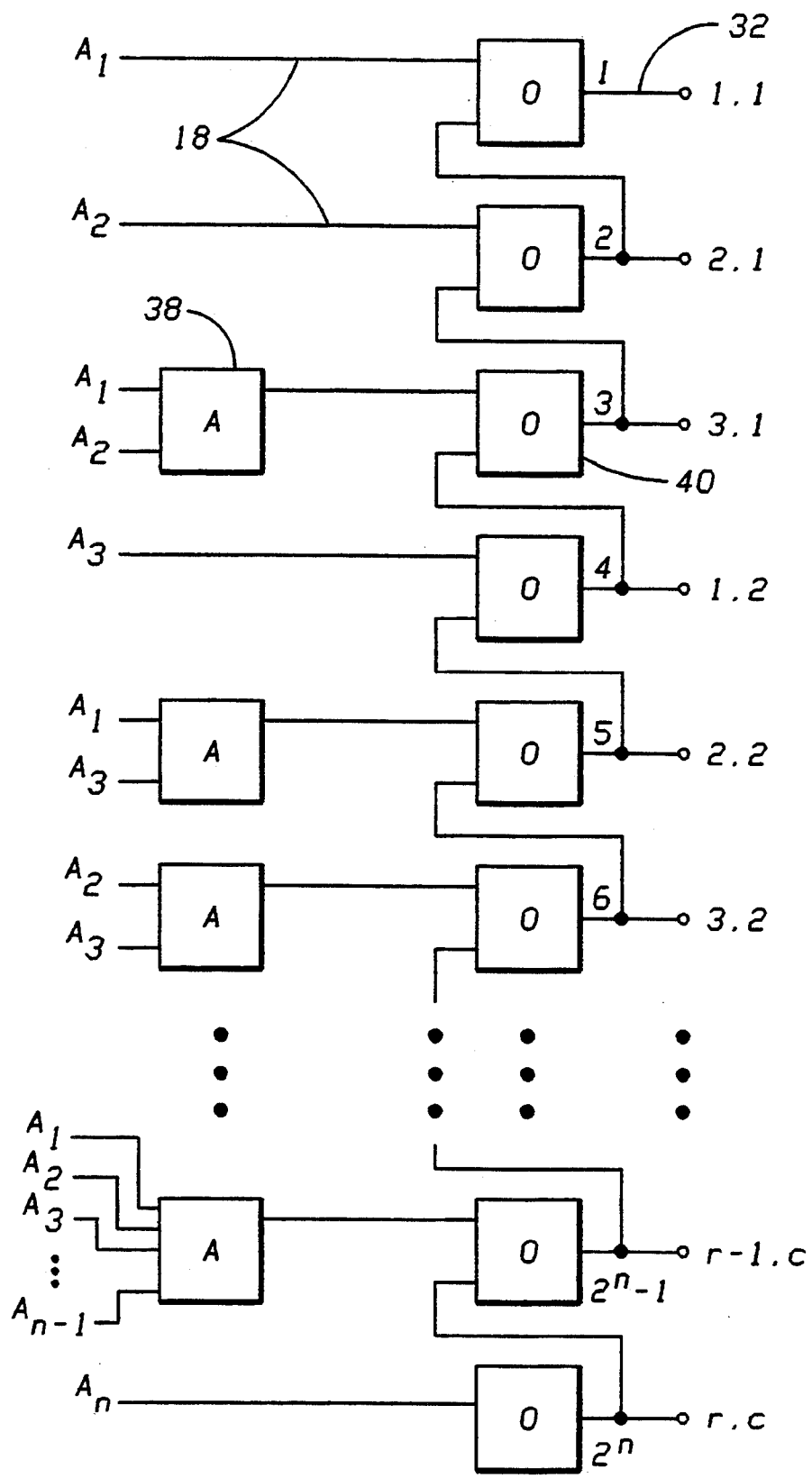
FIG. 3 shows the logic implementation of the decoder of FIG. 2B.

FIG. 3 shows a serial implementation of the minimum logic required to implement the decoder 26 which controls the operation of the array 28 of delay elements 30. The logic requires only AND gates 38 and OR gates 40. The first set of control signals 18 is shown as address lines $A_1$ through $A_n$. The decoder logic is represented by the AND gates 38 and the OR gates 40, and the outputs of the OR gates are the decoder output lines 32. Thus, the number of OR gates required equals the number of delay elements 30 in the r×c matrix.

As explained above, the delay elements 30 in the array 28 are activated starting with the $30_{1,1}$ position and continuing down successive rows and columns to, ultimately, the $30_{r,c}$ position. The binary encoded address lines $A_1$ through $A_n$ are used as inputs to the AND gates 38 and the OR gates 40. The output of an OR gate is used as an input to its corresponding delay element, and also to a preceding OR gate. Thus, when the output of a particular OR gate (i.e. a decoder output line) is active, all other OR gate outputs above it are also active. This logic design will insure that when a particular delay element in the matrix is activated, any other delay elements above it in its column and all other delay elements in previous columns will also be activated.

FIG. 4 is a chart illustrating the control inputs required for various sizes of matrices of delay elements. The matrix sizes shown on the chart range from 6 delay elements (assuming a matrix of two rows of three delay elements each) up to 33 delay elements (e.g. a matrix of three rows of eleven delay elements) although larger matrices are contemplated. For matrices comprising less than $2^3$ elements, such as a 2×3 matrix, 3 address lines $A_1$ through $A_3$ are required. For matrices comprising less than $2^4$ delay elements, such as a 3×5 matrix, 4 address lines $A_1$ through $A_4$ are required. Thus, for arrays of less than $2^n$ delay elements, the first set of control signals 18 (address lines $A_1$ through $A_n$) requires a maximum of n control signals.

Accordingly, the preferred embodiment of a digital voltage controlled oscillator for use in a digital phase lock loop has been described. With the foregoing description in mind, however, it is understood that this description is made only by way of example, that the invention is not limited to the particular embodiments described herein, and that various rearrangements, modifications and substitutions may be implemented without departing from the true spirit of the invention as hereinafter claimed.

We claim:

1. A digital phase lock loop, comprising:
   a digital voltage controlled oscillator which is responsive to a first set of control signals to provide an output signal;
   a phase detector for receiving and comparing the frequency of said output signal with the frequency of a reference signal, and for outputting a second control signal based on the comparison; and
   a digital filter which is responsive to said second control signal to output said first set of control signals to said digital voltage controlled oscillator, said digital voltage controlled oscillator comprising (i) an array of delay elements and (ii) a decoder for receiving said first set of said control signals and selectively activating one or more of said delay elements in response thereto.

2. The digital phase lock loop of claim 1, wherein said digital filter comprises an up/down counter.

3. The digital phase lock loop of claim 2, wherein said array of delay elements comprises a plurality of delay elements, each of which enables discrete incremental changes in the delay provided by said array.

4. The digital phase lock loop of claim 3, wherein each of said delay elements in said array comprises a delay circuit including an inverter and a capacitor, and wherein said one or more delay elements are selectively activated by said decoder by selectively switching said capacitor in and out of said circuit.

5. The digital phase lock loop of claim 3, wherein said array of delay elements comprises a matrix of a plurality r of rows and a plurality c of columns of individual delay elements, and wherein said individual delay elements are selectively activated in a predetermined order, said predetermined order beginning with the delay element corresponding to the first row and the first column of said matrix, continuing down the first column until all delay elements in said first column are activated, and subsequently activating the second and then the remaining columns in a like order.

6. The digital phase lock loop of claim 5, wherein input and output ends of each of said rows of delay elements are logically coupled.

7. The digital phase lock loop of claim 5, wherein said decoder provides a separate output line for each of said delay elements which is selectively activated.

8. The digital phase lock loop of claim 7, wherein for arrays of less than $2^n$ delay elements, said first set of control signals comprises a maximum of n control signals.

9. The digital phase lock loop of claim 8, wherein logic required to implement said decoder requires only a single AND gate and a single OR gate for each of said delay elements in said array.

10. A digital voltage controlled oscillator for use in a digital phase lock loop comprising:
   (i) an array of delay elements arranged in a matrix of rows and columns, and
   (ii) a decoder for receiving said first control signal and selectively activating one or more of said delay elements in said array in response thereto.

11. The digital voltage controlled oscillator of claim 10, wherein said array of delay elements comprises a plurality of delay elements, each of which enables discrete incremental changes in the delay provided by said array.

12. The digital voltage controlled oscillator of claim 11, wherein each of said delay elements in said array comprises a delay circuit including an inverter and a capacitor, and wherein said delay elements are selectively activated by said decoder by selectively switching said capacitor in and out of said circuit.

13. The digital voltage controlled oscillator of claim 11, wherein said matrix comprises a plurality r of rows and a plurality c of columns of individual delay elements, and wherein said individual delay elements are selectively activated in a predetermined order, said predetermined order beginning with the delay element corresponding to the first row and the first column of said matrix, continuing down the first column until all delay elements in said first column are activated, and subsequently activating the second and then the remaining columns in a like order.

14. The digital voltage controlled oscillator of claim 13, wherein input and output ends of each of said rows of delay elements are logically coupled.

15. The digital voltage controlled oscillator of claim 13, wherein said decoder provides a separate output line for each of said delay elements which is selectively activated.

16. The digital voltage controlled oscillator of claim 15, wherein for arrays of less than $2^n$ delay elements, said first set of control signals comprises a maximum of n control signals.

17. The digital voltage controlled oscillator of claim 16, wherein logic required to implement said decoder requires only a single AND gate and a single OR gate for each of said delay elements in said array.

* * * * *